(12) United States Patent
Schlecht et al.

(10) Patent No.: US 11,881,829 B2
(45) Date of Patent: Jan. 23, 2024

(54) METHOD FOR AUDIO PEAK REDUCTION USING ALL-PASS FILTER

(71) Applicants: AAC Microtech (Changzhou) Co., Ltd., Changzhou (CN); AAC ACOUSTIC TECHNOLOGIES (SHENZHEN) CO., LTD., Shenzhen (CN)

(72) Inventors: Sebastian Schlecht, Tampere (FI); Leonardo Fierro, Tampere (FI); Vesa Valimaki, Tampere (FI); Juha Backman, Tampere (FI)

(73) Assignees: AAC Microtech (Changzhou) Co., Ltd., Changzhou (CN); AAC Acoustic Technologies (Shenzhen) Co., Ltd., Shenzhen (CN)

( * ) Notice: Subject to any disclaimer, the term of this patent is extended or adjusted under 35 U.S.C. 154(b) by 113 days.

(21) Appl. No.: 17/732,417

(22) Filed: Apr. 28, 2022

(65) Prior Publication Data

US 2023/0353112 A1 Nov. 2, 2023

(51) Int. Cl.
H03G 7/00 (2006.01)
(52) U.S. Cl.
CPC .......... H03G 7/007 (2013.01); H03G 7/004 (2013.01)
(58) Field of Classification Search
CPC ...... H03G 7/007; H03G 7/004; H03G 11/002; H03G 11/008; H03G 11/04; H03G 11/08
See application file for complete search history.

(56) References Cited

U.S. PATENT DOCUMENTS

2009/0287496 A1\* 11/2009 Thyssen ................. H03G 7/007
704/500

OTHER PUBLICATIONS

S. J. Schlecht, L. Fierro, V. Välimäki and J. Backman, "Audio Peak Reduction Using a Synced allpass Filter," ICASSP 2022—2022 IEEE International Conference on Acoustics, Speech and Signal Processing (ICASSP), Singapore, Singapore, 2022, pp. 1006-1010, doi: 10.1109/ICASSP43922.2022.9747877 (Year: 2022).\*

\* cited by examiner

*Primary Examiner* — Kile O Blair
(74) *Attorney, Agent, or Firm* — W&G Law Group

(57) ABSTRACT

Provided is a method for audio peak reduction using an all-pass filter, including: determining a delay parameter m and a gain parameter g based on a formula (1):

$$\arg\min_{m,g}\max_{n} |y_{m,g}(n)|, \qquad (1)$$

absolute peak map $$Y(m, g) = \max_{n} |y_{m,g}(n)|,$$

$y_{m,g}(n)$ represents a processed signal with a time-domain response function and is calculated based on a formula (2): $y_{m,g}(n)=(h_s*x)(n)(2)$, where $h_s$ represents an impulse response function, x (n) represents an input signal, and $h_s$ is calculated based on formula (3):

$$H_S(z) = \frac{g + z^{-m}}{1 + gz^{-m}}. \qquad (3)$$

This method is widely used in the reproduction, storage and broadcasting of sound, and the computational complexity is small, which is a supplement to the traditional nonlinear compression algorithm.

10 Claims, 2 Drawing Sheets

METHOD FOR AUDIO PEAK REDUCTION USING ALL-PASS FILTER

TECHNICAL FIELD

The present invention relates to the technical field of audio digital signal processing, in particular to a method for audio peak reduction using an all-pass filter.

BACKGROUND

Dynamic range reduction of a signal via peak amplitude limiting is an established process in modern audio signal processing, as it can be used to restrict the dynamics of a sound and, consequently, maximize its loudness. A common compressor used for this purpose is called a limiter, which prevents a signal from exceeding the available dynamic range. In sound engineering and music production, limiting is applied in combination with a gain element to increase the perceived loudness by reducing the signal's peak—to— RMS (Root Mean Square) ratio.

Traditional dynamic range reduction involves nonlinear techniques, which introduce new frequency components and, consequently, harmonic distortion that can negatively affect the sound quality.

SUMMARY

The present invention provides a method for audio peak reduction using an all-pass filter, aiming to solve the technical problems in the related art, and being capable of being widely used in real-time sound reproduction with less calculation.

An embodiment of the present invention provides a method for audio peak reduction using an all-pass filter, including: determining a delay parameter m and a gain parameter g based on a formula (1):

$$\arg\min_{m,g}\max_{n}|y_{m,g}(n)|, \quad (1)$$

where absolute peak map $$Y(m, g) = \max_{n}|y_{m,g}(n)|,$$

$y_{m,g}(n)$ represents a processed signal with a time-domain response function and is calculated based on a formula (2):

$$y_{m,g}(n)=(h_s*x)(n) \quad (2),$$

where $h_s$ represents an impulse response function, $x(n)$ represents an input signal, and $h_s$ is calculated based on a formula (3):

$$H_S(z) = \frac{g + z^{-m}}{1 + gz^{-m}}. \quad (3)$$

As an improvement, the delay parameter m is synced to a dominant transient peak in an autocorrelation function.

As an improvement, a feedback choice is solved with a gradient descent on the gain parameter g, where a gain gradient of the gradient descent is computed by a filter derivative and an optimal step size of the gradient descent is optimally solved with linear programming.

As an improvement, a gain gradient at time n is calculated based on a formula (4):

$$y'_{m,g}(n) = \frac{\partial y_{m,g}}{\partial g}(n) = (h'_s * x)(n). \quad (4)$$

As an improvement, a transfer function of the gain gradient is calculated based on a formula (5):

$$H'_S(z) = \frac{\partial H_S}{\partial g}(z) = \frac{1 - z^{-2m}}{1 + 2gz^{-m} + g^2 z^{-2m}}. \quad (5)$$

As an improvement, a conservative upper bound for the gain gradient is calculated based on a formula (6):

$$|y_{m,g}'(n)| \leq \Sigma_{n=0}^{\infty}|h_s'(n)| \quad (6).$$

As an improvement, an optimal step size is calculated based on a formula (7):

$$\arg\min_{\gamma}\max_{n}|y_{m,g}(n) + \gamma y'_{m,g}(n)|. \quad (7)$$

As an improvement, the formula (7) is simplified to be a formula (8):

$$\arg\min_{\gamma}\max_{n}\tilde{y}_{m,g}(n) + \gamma\tilde{y}'_{m,g}(n). \quad (8)$$

As an improvement, sign—flipped gain amplitude and gradient lines are calculated based on a formula (9):

$$\tilde{y}_{m,g}(n) = |y_{m,g}(n)|; \quad (9)$$

$$\tilde{y}'_{m,g}(n) = \frac{y_{m,g}(n)}{|y_{m,g}(n)|} y'_{m,g}(n).$$

As an improvement, an optimal step size is calculated based on a formula (10):

$$\min_{\alpha} \text{ s.t. } \forall n: \tilde{y}_{m,g}(n) + \gamma\tilde{y}'_{m,g}(n) \leq \alpha. \quad (10)$$

Compared with the related art, the present invention provides a computationally efficient method for linear compression of the audio waveform. In a scheme, for each transient peak, the delay line of the all-pass filter is synced to match delay of the peaks of the signal's auto-correlation function. In another scheme, iteratively clipping the input signal while recovering the magnitude spectrum also results in a reduction in the peak signal value. This method is widely used in the reproduction, storage and broadcasting of sound, and the computational complexity is small, which is a supplement to the traditional nonlinear compression algorithm. In future work, the method can be generalized to frequency-dependent active filters, and can be adapted to online processing by optimizing the all-pass filter for each signal frame.

BRIEF DESCRIPTION OF DRAWINGS

In order to better illustrate technical solutions in embodiments of the present invention or in the related art, the accompanying drawings used in the embodiments and in the related art are briefly introduced as follows. It should be noted that the drawings described as follows are merely part of the embodiments of the present invention, and other drawings can also be acquired by those skilled in the art without paying creative efforts.

DESCRIPTION OF EMBODIMENTS

The embodiments described below with reference to the accompanying drawings are exemplary and are merely used to explain the present invention, but not to limit the present invention.

An embodiment of the present invention provides a method for audio peak reduction using an all-pass filter, which can avoid distortion introduced by a traditional non-linear compressor, and provides peak reduction by acting on the signal phase. In this way, the signal energy around a waveform peak can be smeared while maintaining the total energy of the signal. The method includes the following steps.

A delay parameter m and a gain parameter g of the all-pass filter is calculated based on a formula (1) as follows.

$$\arg\min_{m,g}\max_{n}|y_{m,g}(n)|. \quad (1)$$

In the formula (1), absolute peak map $$Y(m, g) = \max_{n}|y_{m,g}(n)|,$$

$y_{m,g}(n)$ represents a processed signal with a time-domain response function and can be calculated based on a formula (2) as follows.

$$y_{m,g}(n)=(h_s*x)(n) \quad (2).$$

In the formula (1), $h_s$ represents an impulse response function, $x(n)$ represents an input signal, and $h_s$ can be calculated based on a formula (3) as follows.

$$H_S(z) = \frac{g + z^{-m}}{1 + gz^{-m}}. \quad (3)$$

As the structure is sparse, the non-zero values of the all-pass filter impulse response parameter are placed on a regular grid. In turn, the all-pass filter can generate large group delays with minimal computational effort. The delay parameter m and the gain parameter g shape the group delay of the filter. Depending on choices of the delay parameter m and the gain parameter g, the filter can reduce the peak value of a signal.

The delay parameter m and the gain parameter g of the all-pass filter can be determined based on the above-mentioned formula (1). When the absolute peak map $$Y(m, g) = \max_{n}|y_{m,g}(n)|$$

takes the minimum value, values of the delay parameter m and the gain parameter g can be determined.

Figure 1A:
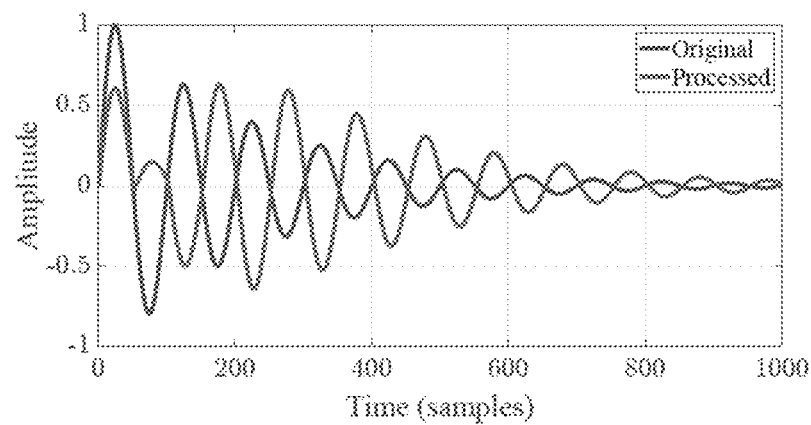
FIG. 1a shows an application of a synced all-pass filter on an exponentially-decaying sine wave, and illustrates original and processed sounds for m=50 and g=0.67.
Figure 1B:
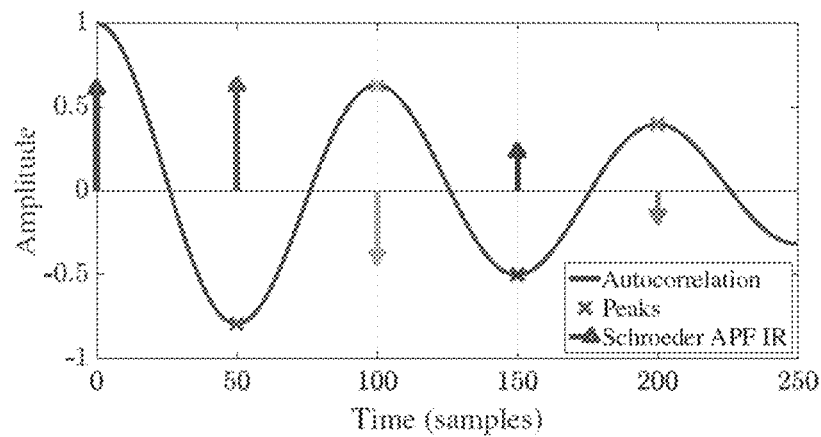
FIG. 1b shows an application of a synced all-pass filter on an exponentially-decaying sine wave, and illustrates an autocorrelation function and an impulse response function for m=50 and g=0.67.
Figure 1C:
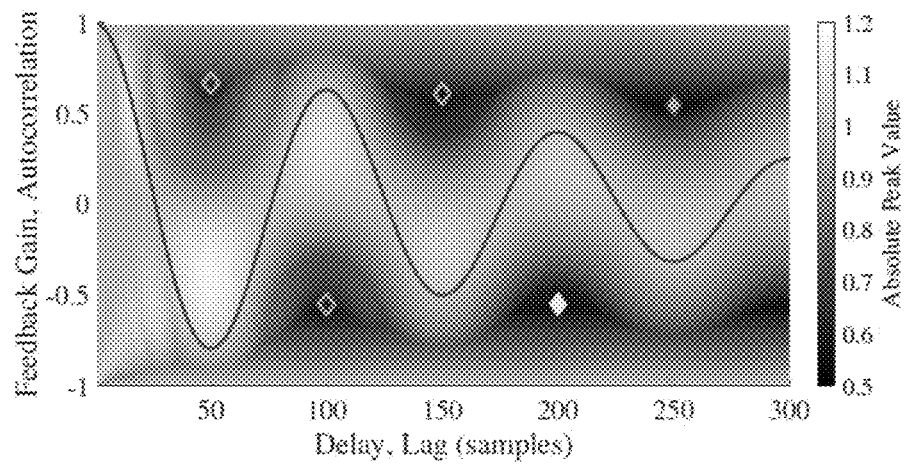
FIG. 1c shows an application of a synced all-pass filter on an exponentially-decaying sine wave, and illustrates an absolute peak map (grey) and an autocorrelation function (blue curve)

In the related art, the absolute peak map Y(m, g) can be computed with an exhaustive grid search. FIG. 1c presents an example of the exhaustive grid search (pink diamond marker). Solving the peak reduction problem requires an exhaustive grid search for all parameter values, which is computationally inefficient.

Therefore, an embodiment of the present invention provides a computationally efficient method for linear compression of the audio wave form. All examples are at a sample rate of 44.1 kHz In this embodiment, the delay parameter m is synced to the dominant transient peaks in the autocorrelation function $R_{xx}(m)$. FIG. 1a illustrates a motivating example of an exponentially—decaying sine wave. With reference to FIGS. 1a, 1b and 1c, it can be seen from FIG. 1b that if the delay parameter m is chosen to match the sine semiperiod, the phase smearing produces destructive interference over the first two cycles, reducing the overall peak level, as demonstrated by the red curve in FIG. 1a. The absolute peak map Y(m, g) for the decaying sine is shown in FIG. 1c, overlayed with the normalized autocorrelation function $R_{xx}$(m). The lowest autocorrelation peak corresponds to m=50 and g=0.67. The other autocorrelation peak time lags also lead to minima in the absolute peak map Y(m, g), namely m=150, 250 . . . for positive g and m=100, 200 . . . for positive g.

Overall, a good choice is found in syncing the delay parameter m to one among the two most dominant negative peaks and the two most dominant positive peaks of the autocorrelation function $R_{xx}(m)$. This design further reduces the search space, without significantly affecting the reduction performance. An all-pass filter following this design is named synced all-pass filter (SyncAPF).

Further, assuming that the delay parameter m is fixed and the gain parameter g is optimized, the feedback choice is solved with a gradient descent (GD) on the gain parameter g, where the gradient is computed by a filter derivative and the optimal step size of the GD can be optimally solved with linear programming.

Given a processed signal with an initial gain g, the gain gradient at time n can be calculated based on a formula (4).

$$y'_{m,g}(n) = \frac{\partial y_{m,g}}{\partial g}(n) = (h'_S * x)(n). \quad (4)$$

In the formula, $h_s'$ is the derivative of the impulse response function $h_s$ of the all-pass filter. The corresponding transfer function is calculated based on a formula (5).

$$H'_S(z) = \frac{\partial H_S}{\partial g}(z) = \frac{1 - z^{-2m}}{1 + 2gz^{-m} + g^2 z^{-2m}}. \quad (5)$$

While the derivative $h_s'$ of the impulse response function $h_s$ retains the sparsity and, consequently, the efficiency of the original filter: the total number of multiplications simply increases from one to two. Assuming the amplitude of x(n) only spans the [−1,1] range, a conservative upper bound for the gradient is introduced based on (4). Please refer to a formula (6).

$$|y_{m,g}'(n)| \leq \Sigma_{n=0}^{\infty} |h_s'(n)| \quad (6).$$

For small changes of the feedback gain, signal samples carrying low values will not produce a relevant impact on the peak value, i.e. the peak amplitude variation is a smooth function of the gain.

A standard GD determines a suitable step size along the direction of the given gradient for the parameter update. The optimal step size γ is given based on a formula (7) by stating the formula (1) as a gradient descent.

$$\underset{\gamma}{\operatorname{argmin}} \max_n |y_{m,g}(n) + \gamma y'_{m,g}(n)|. \quad (7)$$

The formula (7) can be simplified by removing the absolute value, to obtain formula (8).

$$\underset{\gamma}{\operatorname{argmin}} \max_n \tilde{y}_{m,g}(n) + \gamma \tilde{y}'_{m,g}(n). \quad (8)$$

In addition, formula (9) is provided.

$$\tilde{y}_{m,g}(n) = |y_{m,g}(n)|; \; \tilde{y}'_{m,g}(n) = \frac{y_{m,g}(n)}{|y_{m,g}(n)|} y'_{m,g}(n). \quad (9)$$

The formula (9) are the sign—flipped amplitude and gradient lines. This is only
accurate if $y_{m,g}+\gamma y_{m,g}',g(n)$ does not cross the zero axis in the region of interest. Nonetheless, this simplification is quasi-optimal: as the gradient is relatively small, only large values of $\tilde{y}_{m,g}(n)$ contribute to the solution for small step sizes. This is equivalent to the following linear program.

$$\min_{\alpha} \text{ s.t. } \forall n: \tilde{y}_{m,g}(n) + \gamma \tilde{y}'_{m,g}(n) \leq \alpha. \quad (10)$$

Thus, the step size γ is obtained, and the values for the new gain parameter $g_{i+1}=g_i+\gamma$ can be updated, where i is the current iteration.

Linear programming can be sped up with a good initialization of the gain parameter g, as GD is bound to only find local minima and multiple initializations might be necessary. A statistical pre-evaluation determined that g=0.7 are strong candidate for gain initialization as those are the most consistently impacting gain values for the all-pass filter, please refer to FIG. 2b and FIG. 1c for supporting examples.

Another element affecting performance and computational cost of GD is the number of iterations. An optional choice will be three iterations, as it has been shown to provide an acceptable trade—off between computational time and achieved peak reduction.

The cost of an iteration step is 1 multiplication (MUL) and 2 additions (ADD) (APF) plus 2 MUL and 3 ADD per sample, or a total of 3 MUL and 5 ADD per sample. The overall computational cost can be further reduced with fast linear programming and by selectively updating peak signal and gradient values.

Based on the embodiments described above, the exponentially—decaying sine example provides further insight on the delay choice algorithm. With reference to FIG. 3c, a solution for the exhaustive grid search (pink diamond marker) is a best possible peak reduction of 5.2 dB with g=0.54 and m=250. A solution for a synced all-pass filter is a best possible peak reduction of 4.8 dB with g=−0.55 and m=200.

Figure 2A:
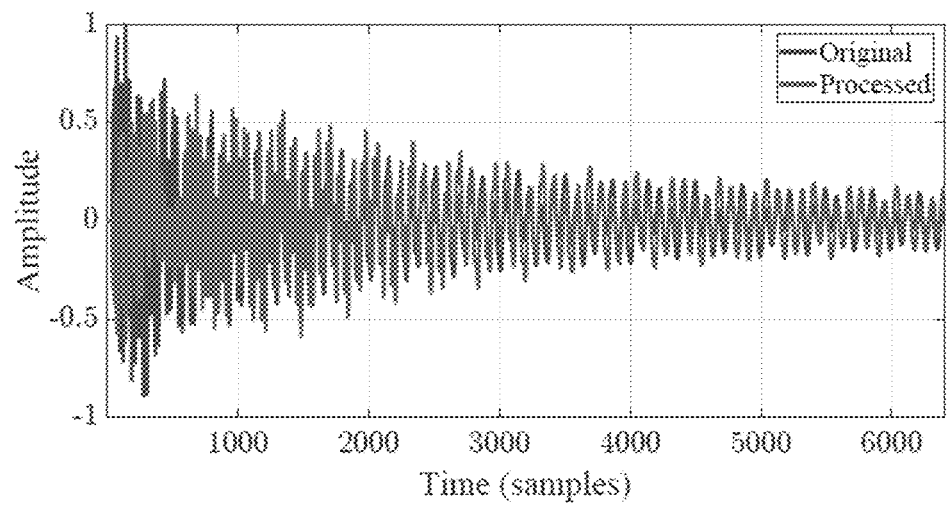
FIG. 2a shows an application of a synced all-pass filter in a mallet environment, and illustrates original and processed sounds for m=272 and g=0.62.
Figure 2B:
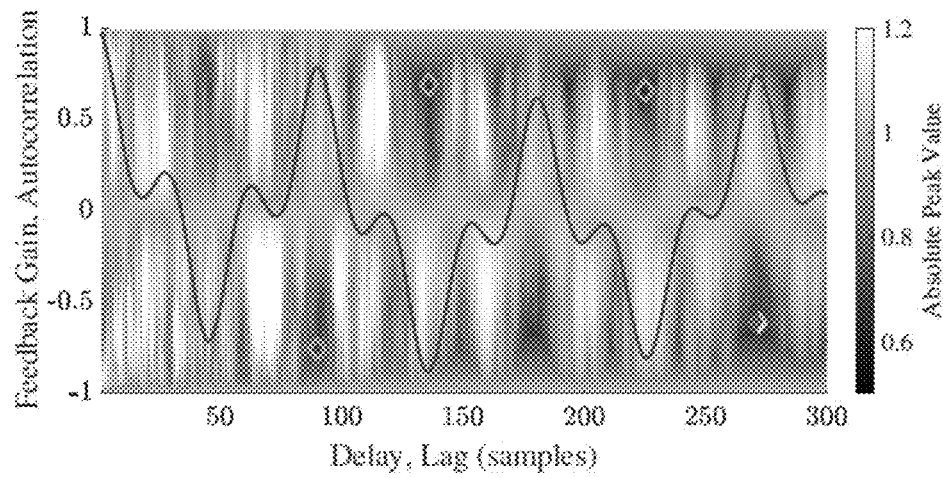
FIG. 2b shows an application of a synced all-pass filter in a mallet environment, and illustrates an absolute peak map (grey) and an autocorrelation function (blue curve).

Processing of a mallet percussion is shown in FIGS. 2a and 2b, for the same gain parameter g and delay parameter m. Here, the best peak reduction is 4.3 dB with m=270 and g=−0.61, while a synced all-pass filter achieves 3.9 dB with m=272 and g=−0.62.

Based on the embodiments described above, the present invention provides a computationally efficient method for linear compression of the audio waveform. In a scheme, for each transient peak, the delay line of the all-pass filter is synced to match delay of the peaks of the signal's auto-correlation function. In another scheme, iteratively clipping the input signal while recovering the magnitude spectrum also results in a reduction in the peak signal value. This method is widely used in the reproduction, storage and broadcasting of sound, and the computational complexity is small, which is a supplement to the traditional nonlinear compression algorithm. In future work, the method can be generalized to frequency-dependent active filters, and can be adapted to online processing by optimizing the all-pass filter for each signal frame.

The structure, features and effects of the present invention have been described in detail above according to the embodiments shown in the drawings. It should be noted that the above description merely illustrates preferred embodiments of the present invention, and does not constitute a limitation to a scope of the present invention. Any modifications, amendments, or equivalent changes based on a concept of the present invention shall fall within a scope of the present invention.

What is claimed is:

1. A method for audio peak reduction using an all-pass filter, comprising:
    determining a delay parameter m and a gain parameter g based on a formula (1):

$$\underset{m,g}{\operatorname{argmin}} \max_n |y_{m,g}(n)|, \quad (1)$$

where absolute peak map $$Y(m, g) = \max_n |y_{m,g}(n)|,$$

$y_{m,g}(n)$ represents a processed signal with a time-domain response function and is calculated based on a formula (2):

$$y_{m,g}(n)=(h_s*x)(n) \quad (2),$$

where $h_s$ represents an impulse response function, x(n) represents an input signal, and $h_s$ is calculated based on a formula (3):

$$H_S(z) = \frac{g + z^{-m}}{1 + gz^{-m}}. \quad (3)$$

2. The method as described in claim 1, wherein the delay parameter m is synced to a dominant transient peak in an autocorrelation function.

3. The method as described in claim 1, wherein a feedback choice is solved with a gradient descent on the gain parameter g, where a gain gradient of the gradient descent is computed by a filter derivative and an optimal step size of the gradient descent is optimally solved with linear programming.

4. The method as described in claim 3, wherein a gain gradient at time n is calculated based on a formula (4):

$$y'_{m,g}(n) = \frac{\partial y_{m,g}}{\partial g}(n) = (h'_S * x)(n). \quad (4)$$

5. The method as described in claim 4, wherein a transfer function of the gain gradient is calculated based on a formula (5):

$$H'_S(z) = \frac{\partial H_S}{\partial g}(z) = \frac{1 - z^{-2m}}{1 + 2gz^{-m} + g^2 z^{-2m}}. \quad (5)$$

6. The method as described in claim 5, wherein a conservative upper bound for the gain gradient is calculated based on a formula (6):

$$|y_{m,g}'(n)| \leq \Sigma_{n=0}^{\infty} = |h_s'(n)|. \quad (6).$$

7. The method as described in claim 4, wherein an optimal step size is calculated based on a formula (7):

$$\underset{\gamma}{\operatorname{argmin}} \underset{n}{\max} |y_{m,g}(n) + \gamma y'_{m,g}(n)|. \quad (7)$$

8. The method as described in claim 7, wherein the formula (7) is simplified to be a formula (8):

$$\underset{\gamma}{\operatorname{argmin}} \underset{n}{\max} \tilde{y}_{m,g}(n) + \gamma \tilde{y}'_{m,g}(n). \quad (8)$$

9. The method as described in claim 7, wherein sign—flipped gain amplitude and gradient lines are calculated based on a formula (9):

$$\tilde{y}_{m,g}(n) = |y_{m,g}(n)|;\ \tilde{y}'_{m,g}(n) = \frac{y_{m,g}(n)}{|y_{m,g}(n)|} y'_{m,g}(n). \quad (9)$$

10. The method as described in claim 9, wherein an optimal step size is calculated based on a formula (10):

$$\underset{\alpha}{\min}\ \text{s.t.}\ \forall n:\ \tilde{y}_{m,g}(n) + \gamma \tilde{y}'_{m,g}(n) \leq \alpha. \quad (10)$$

\* \* \* \* \*